United States Patent [19]

Cheng et al.

[11] Patent Number: 5,746,614

[45] Date of Patent: May 5, 1998

[54] CARD EDGE CONNECTOR WITH EJECTOR

[75] Inventors: Lee-Ming Cheng, Cupertino; Edmond Choy, Union City, both of Calif.; Gwou-Jong Tseng, Taipei Hsien, Taiwan

[73] Assignee: Hon Hai Precision Ind. Co., Ltd., Taiwan

[21] Appl. No.: 823,657

[22] Filed: Mar. 21, 1997

Related U.S. Application Data

[63] Continuation of Ser. No. 420,478, Apr. 12, 1995, Pat. No. 5,634,803.
[51] Int. Cl.$^6$ ................................................ H01R 13/62
[52] U.S. Cl. ............................................................ 439/157
[58] Field of Search ................................. 439/152–160

[56] References Cited

U.S. PATENT DOCUMENTS

| | | | |
|---|---|---|---|
| 5,057,029 | 10/1991 | Noorily | 439/160 |
| 5,074,800 | 12/1991 | Sasao et al. | 439/157 |
| 5,364,282 | 11/1994 | Tondreault | 439/157 |
| 5,634,803 | 6/1997 | Cheng et al. | 439/157 |
| 5,672,069 | 9/1997 | Cheng et al. | 439/160 |

FOREIGN PATENT DOCUMENTS

| | | | |
|---|---|---|---|
| 2241841 | 9/1991 | United Kingdom | 439/160 |

*Primary Examiner*—Khiem Nguyen
*Assistant Examiner*—Eugene G. Byrd

[57] ABSTRACT

A card edge connector (10) includes an insulative housing (12) defining an elongated channel (14) for receiving a card therein. A pair of tower sections (22) are portioned on two opposite ends of the housing (12), and each defines a cavity for receiving therein an ejector (28) wherein each ejector (28) has a main body (36) with an elongated slots (42) extending along almost the whole lengthwise dimension of the main body (36) except the handle (40), and substantially therethrough in a lateral direction thereof so as to provide a good resiliency of the main body (36). A pair of retention protrusions (32) are respectively positioned on two sides of the main body (36) wherein the retention protrusion generally positioned about the middle point of the slot (42), is large enough to resist wear so that the ejector (28) can be easily rotatably moved with regard to the housing (12) while still keeping good retention function with the housing (12) when it is in a vertical position.

14 Claims, 7 Drawing Sheets

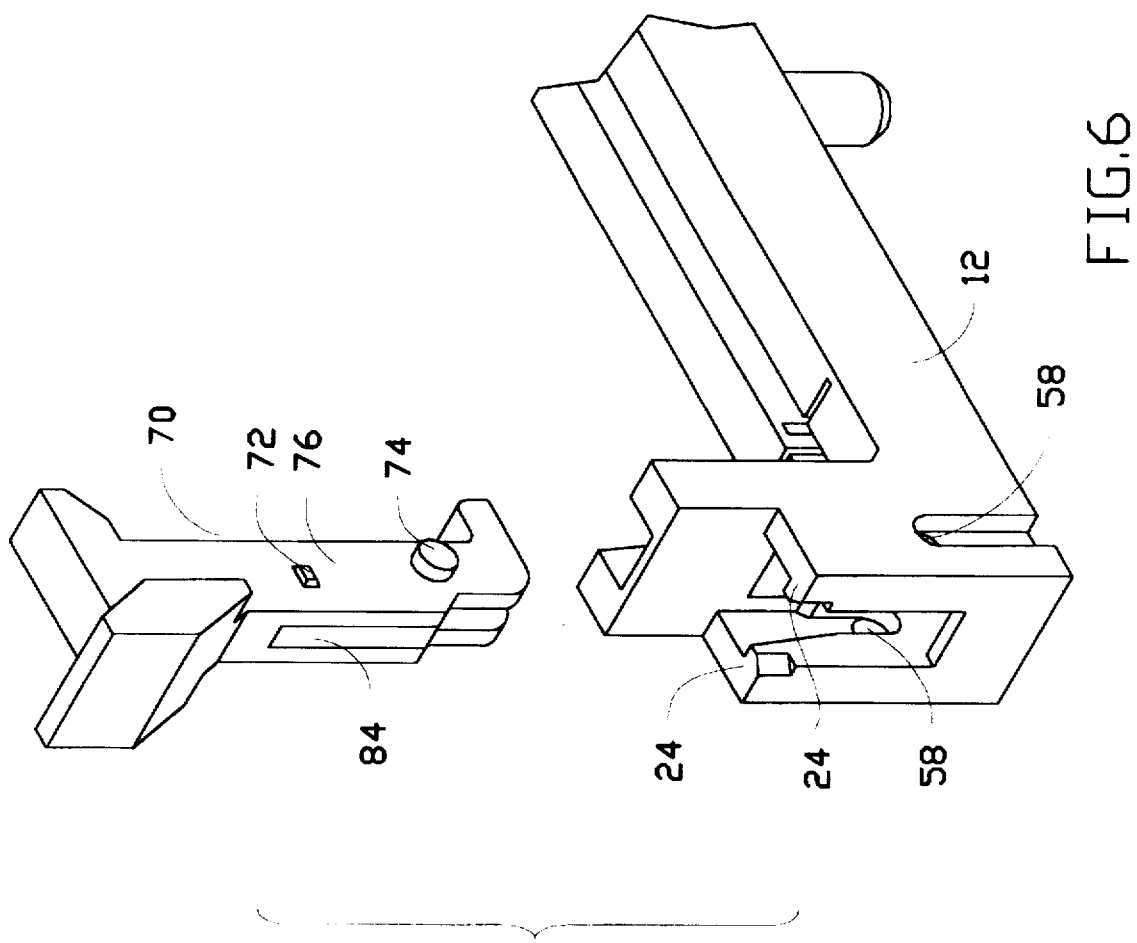

CARD EDGE CONNECTOR WITH EJECTOR

This application is a continuation-in-part of the application Ser. No. 08/420,478 filed Apr. 12, 1995 now U.S. Pat. No. 5,634,803.

BACKGROUND OF THE INVENTION

1. Field of The Invention

The invention relates to card edge connectors, and particularly to the DIMM (Dual In-line Memory Module) connector having the ejector at the end of the housing.

2. The Prior Art

The copending application Ser. No. 08/420,478 filed on Apr. 12, 1995, discloses a card edge connector having ejectors at two opposite ends for ejection of the card inserted therein. In that application and as shown in FIG. 6, the ejector (70) has a central slot (84) to provide flexibility thereof so as to allow inward deflection of the main body (76) for easy installation of the outward projecting spindle (74) into the hole (58) in the housing (12). Anyhow, such slot (84) can provide expected resiliency for inward movement of the outward projecting spindle (74) for installation purpose, but can not provide the desired deflectable structure around the dimple (72) thereon which is designedly engaged with the side wall (24) of the housing (12) so that the ejector (70) may be retained in the vertical position in the housing (12) for locking the card in position. Under this situation, the dimple (72) should be relatively small for easy rotative passage in-and-out with regard to the side wall (24) of the housing (12). Unfortunately, the relative tiny dimple (72) may be easily gradually worn out by the side wall (24) after several times use due to lacking sufficient resiliency thereabout, thus resulting in loose retention of the ejector (70) in its vertical position in the housing (12) without efficient latching function for the inserted card. In contrast, enlarging the dimple (72) may overcome this disadvantage but makes it difficult to rotatively move the ejector (70) with regard to the housing (12).

Therefore, an object of the invention is to provide a card edge connector with the ejector having the relatively large dimple thereon for efficiently retaining the ejector in a vertical position in the housing of the connector, and also having good resiliency around the dimple so that there is no difficulty to rotatively move the ejector with regard to the housing and no wear occurs on the dimple.

SUMMARY OF THE INVENTION

According to an aspect of the invention, a card edge connector includes an insulative housing defining an elongated channel for receiving a card therein. A pair of tower sections are portioned on two opposite ends of the housing, and each defines a cavity for receiving therein an ejector wherein each ejector has a main body with an elongated slots extending along almost the whole lengthwise dimension of the main body except the handle, and substantially therethrough in a lateral direction thereof so as to provide a good resiliency of the main body. A pair of retention protrusions are respectively positioned on two sides of the main body wherein the retention protrusion generally positioned about the middle point of the slot, is large enough to resist wear so that the ejector can be easily rotatably moved with regard to the housing while still keeping good retention function with the housing when it is in a vertical position.

BRIEF DESCRIPTION OF THE DRAWINGS

FIG. 1(A) is an enlarged perspective view of the ejector of the connector of FIG. 1.

FIG. 6 is a perspective view of the card edge connector with the ejector disclosed in the copending parent application.

DETAILED DESCRIPTION OF THE PREFERRED EMBODIMENTS

Figure 1:
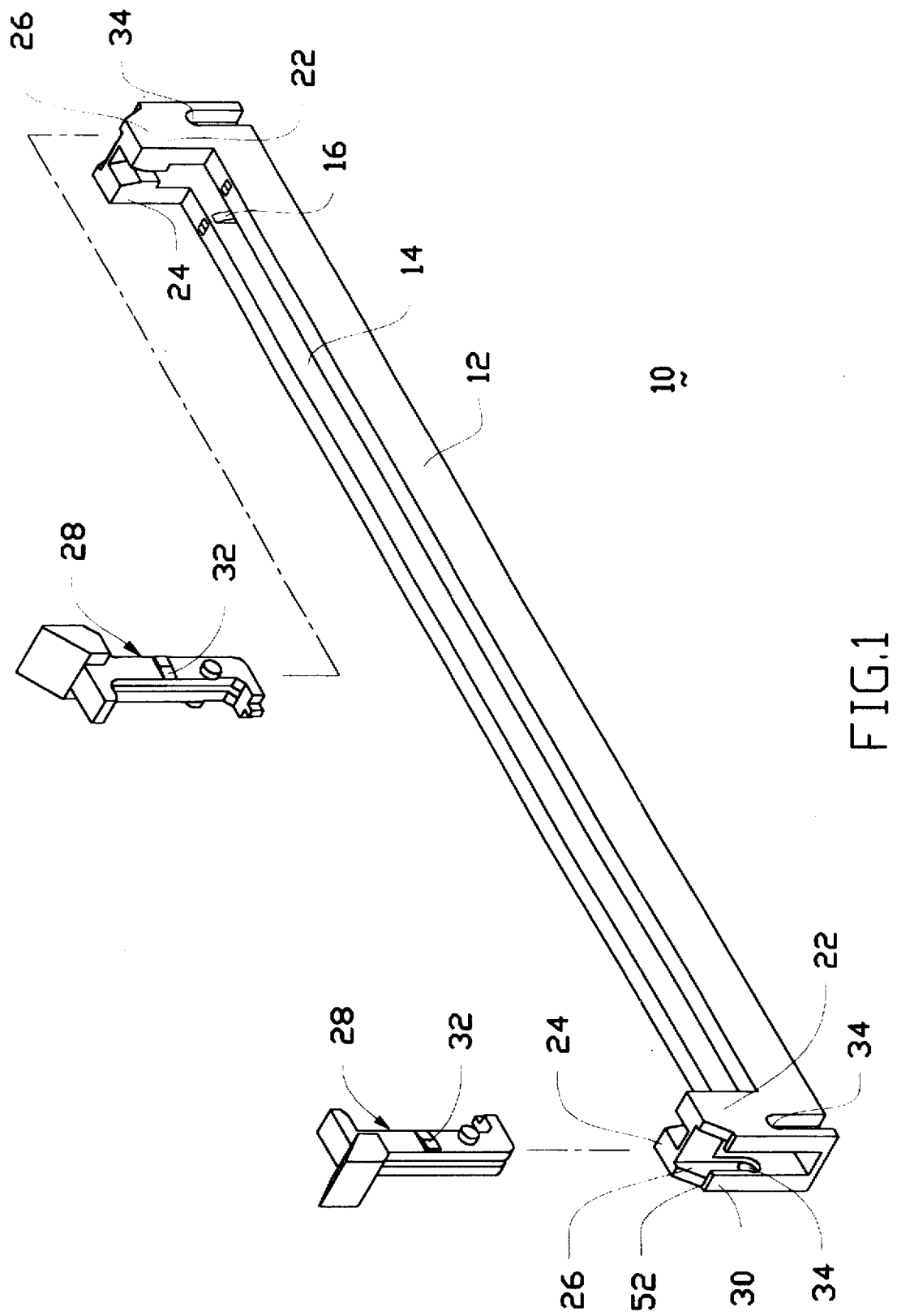
FIG. 1 is an exploded perspective view of a presently preferred embodiment of a card edge connector according to the invention.
Figure 1:
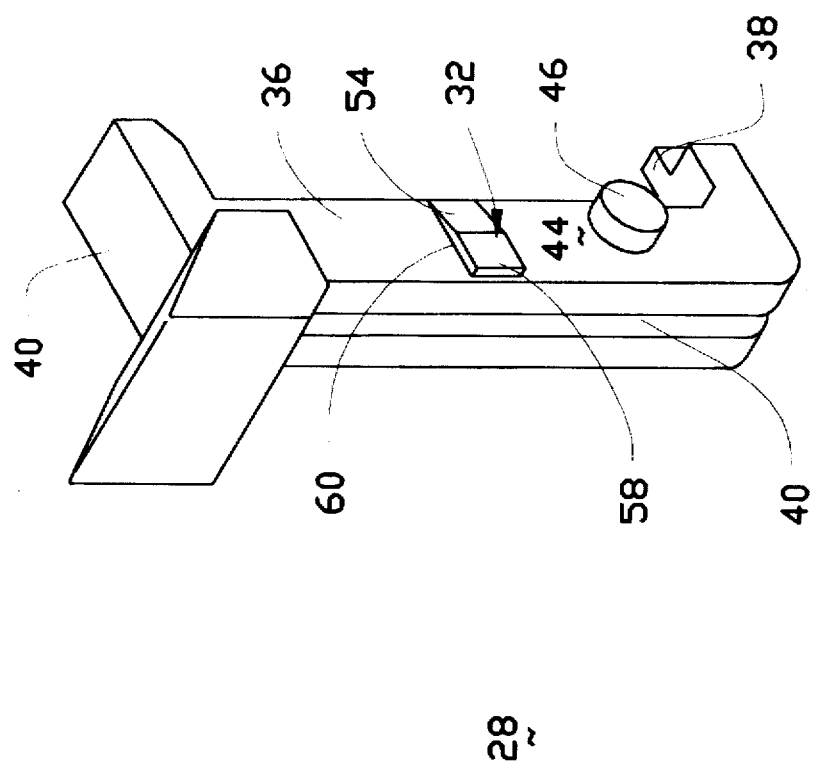
Figure 2:
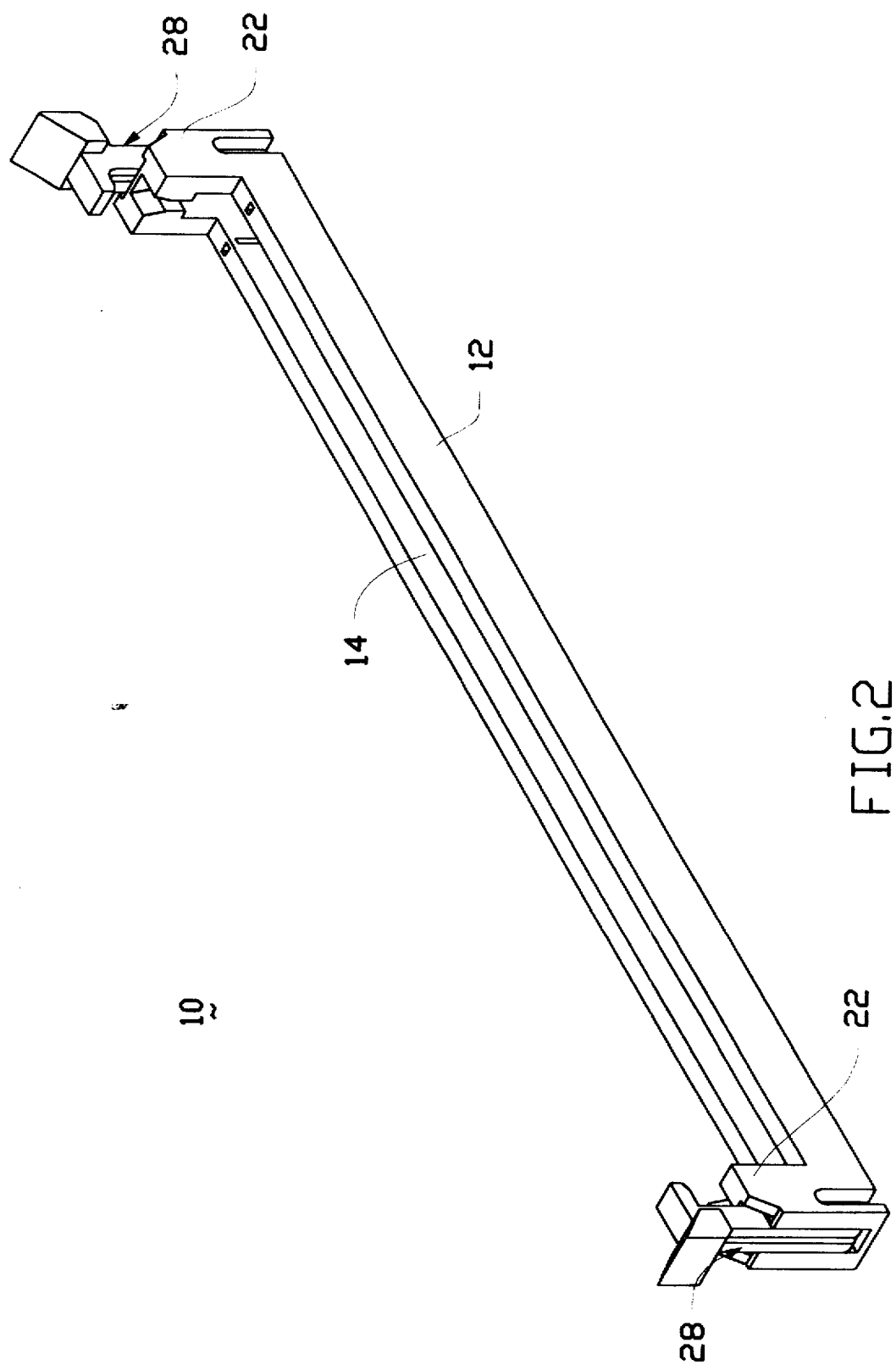
FIG. 2 is a perspective view of an assembled card edge connector of FIG. 1.
Figure 3:
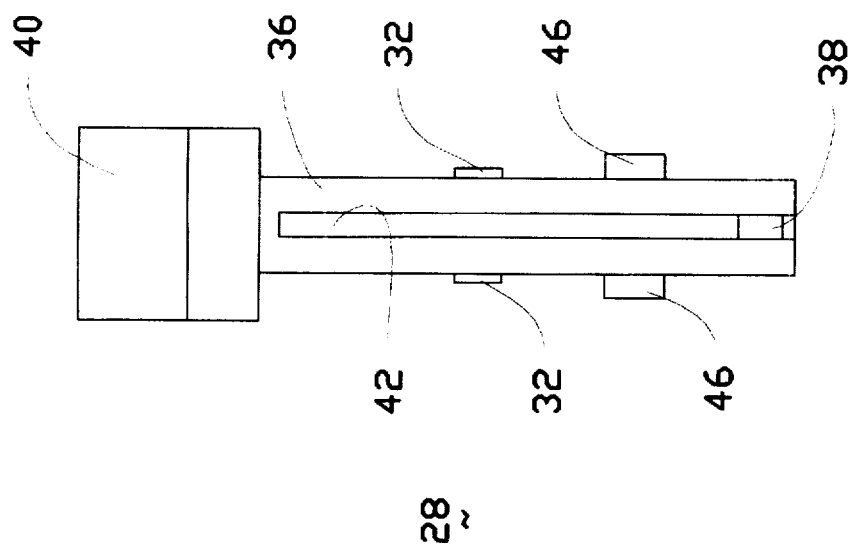
FIG. 3(A) is a side view of the ejector of the connector of FIG. 1.
FIG. 3(B) is a back plan view of the ejector of the connector of FIG. 1.
Figure 3:
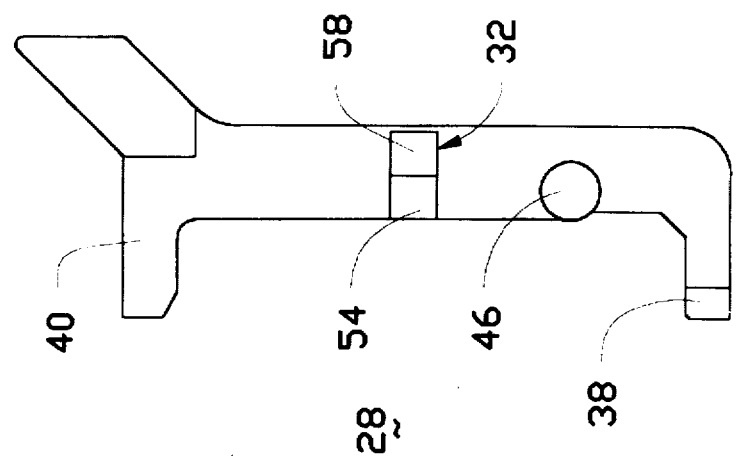
Figure 4:
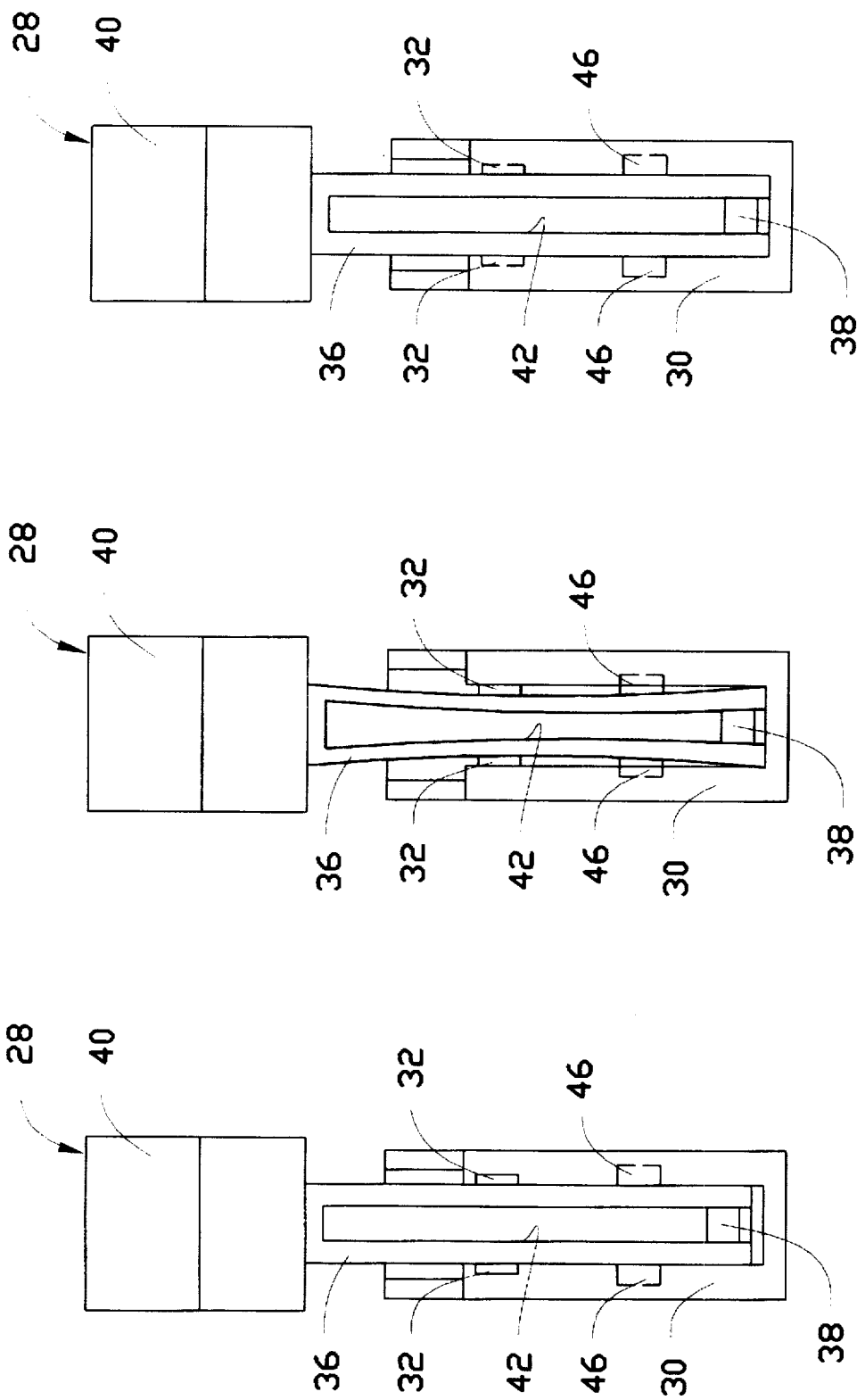
FIGS. 4(A)–4(C) are enlarged elevational views of the ejector of the connector of FIG. 1 in the housing to show how the main body of the ejector is inward deflected.

References will now be in detail to the preferred embodiments of the invention. While the present invention has been described in with reference to the specific embodiments, the description is illustrative of the invention and is not to be construed as limiting the invention. Various modifications to the present invention can be made to the preferred embodiments by those skilled in the art without departing from the true spirit and scope of the invention as defined by appended claims.

It will be noted here that for a better understanding, most of like components are designated by like reference numerals throughout the various figures in the embodiments. Attention is directed to FIGS. 1–4(C) wherein a card edge connector 10 includes an elongated insulative housing 12 defining a central channel 14 for receiving a card (not shown) therein. A plurality of passageways 16 (only few shown) are positioned by two sides of the channel 14 for receiving a corresponding number of contacts 18 therein wherein each contact (not shown) includes an engagement section 20 projecting into the channel 14 for engagement with the corresponding pad on the card.

A pair of towers 22 are respectively positioned at two opposite ends of the housing 12 wherein each tower 22 includes an inner section 24 defining a U-shaped wall portion for confining the side section of the card therein, and an outer section 26 for receiving an ejector 28 therein. The end wall 30 of the outer section 26 is lower than the inner section 24 for cooperation with two retention protrusions 32 of the ejector 28, and this will be illustrated in detail later. A pair of holes 34 horizontally extending through the outer section 25.

Correspondingly, referring to FIGS. 1(A), 3(A) and 3(B), an ejector 28 including an elongated main body 36 with a kicker 38 at the bottom and a handle/locker 40 at the top thereof. A slot 42 extends along almost the whole lengthwise dimension of the main body 36 of the ejector 28 and therethrough in a lateral direction. Each of the protrusions 32 is generally positioned about the mid-point of each side surface 44 of the main body 36 and a spindle 46 is disposed on the main body 36 about the mid-point between the kicker 38 and the protrusion 32.

The top edge 50 of the retention protrusion 32 is generally flush with the top edge 52 of the end wall 30 of the outer wall 26, and the height of the protrusion 32 is of a relatively significant value in comparison with that of the dimple type as disclosed in the copending parent application. Similarly, the width of the protrusion 32 extends almost the full lateral dimension of the main body 36 whereby the cross-section of the protrusion 32 is of a trapezoid shape including a longer slanted surface 54 facing to the center channel 14, and the mutually parallel top platform 58 and base 60 wherein the base 60 is integrally formed on the main body 36. It should be known that the thickness, i.e., the distance between the base 60 and the platform 58, is relatively greater than that of the copending prior copending parent application which uses a minor dimple structure, because the slot 42 provides a greater resiliency about the protrusions 32 of the main body 36 in the invention.

Referring to FIGS. 4(A)-4(C), when operated, the ejector 26 has its spindles 46 received within the corresponding holes 34 of the outer section 26 so that the ejector 28 can be rotated about the spindles 46 with regard to the housing 12. Because the retention protrusions 32 are substantially positioned about the mid-point of the slot 42 where a maximum deflection occurs to the main body 36 when an inward deformation of the main body 36 is brought up by the end wall 30 of the outer section 26, the retention protrusions 32 may easily pass over the end wall 30 of the outer section 26 in and out when the ejector 28 is rotatably moved back and forth. Through the cooperation of the retention protrusions 32 of the ejector 28 and the end wall 30 of the housing 12, the ejector 28 can be reliably and properly retained with regard to the housing 12 due to its relatively larger dimension, while also be easily and smoothly rotatively moved with regard to the housing 12 due to the substantially long enough slot 42 formed along the main body 36 and the protrusions 32 being disposed about the mid-point of the slot 42 or the main body 36 where a maximum inward deflection may occur.

It should be noted that the slot 42 is designed to be large enough to provide sufficient space for the inward deflection of the main body 36, and also to be small enough to maintain the strength of the whole structure of the main body 36. Therefore, in the invention, the slot 42 in the main body 36 only provides the space for inward inflection of the main body 36, and does not receive any portions of the housing 12 or of the card inserted within the housing 12.

Figure 5:
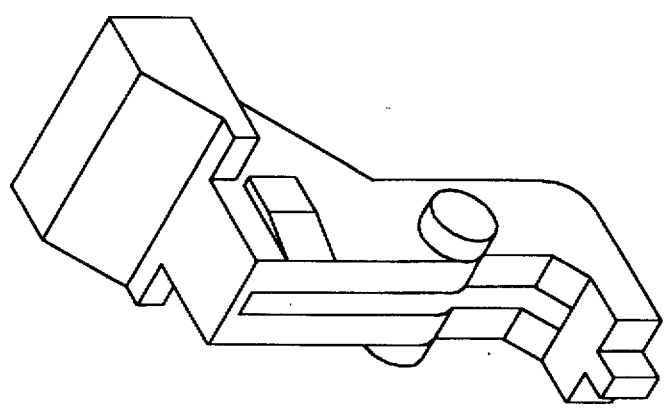
FIG. 5 is another embodiment of the ejector according to the invention.

FIG. 5 shows another embodiment of the ejector 28' wherein a locking portion has been removed therefrom to meet the requirement of the low profile configuration.

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claims.

Therefore, person of ordinary skill in this field are to understand that all such equivalent structures are to be included within the scope of the following claims.

We claim:

1. A card edge connector comprising:
   an elongated insulative housing defining a central channel for receiving a card therein;
   a plurality of passageways disposed by at least one side of the channel for receiving a corresponding number of contacts therein;
   at least one tower formed at one end of the housing;
   an ejector adapted to be received within said tower;
   said ejector including a main body with a kicker at a bottom portion and a locker/handle at a top portion; wherein
   a slot extends along almost a full lengthwise dimension of and through, in a lateral direction, the main body, and at least a retention protrusion is disposed about a mid-point of the slot.

2. The connector as defined in claim 1, wherein the tower further includes an end wall almost flush with the retention protrusion.

3. The connector as defined in claim 1, wherein a cross-section of the protrusion has a substantially trapezoid shape extending laterally almost in a full dimension of a width of the main body.

4. The connector as defined in claim 3, wherein the retention protrusion has a longer slanted surface facing to the central channel.

5. The connector as defined in claim 1, wherein the ejector further includes at least a spindle positioned about a mid-point between the retention protrusion and the kicker for reception with a hole in the tower.

6. The connector as defined in claim 1, wherein the tower includes an inner section and an outer section, and wherein the outer section receives the ejector therein and the inner section confines a side edge of the card therein.

7. An ejector for use with a card edge connector, comprising:
   an elongated main body;
   a kicker positioned at a bottom portion of the main body;
   a handle positioned at a top portion of the main body;
   a slot extending along almost a full lengthwise dimension of the main body; and
   at least a retention protrusion positioned about a mid-point of the slot.

8. The ejector as defined in claim 7, wherein a cross-section of the retention protrusion has a trapezoid shape.

9. The ejector as defined in claim 7, wherein the retention protrusion extends laterally in almost a full dimension of the width of the main body.

10. The ejector as defined in claim 7, wherein the retention protrusion has a longer slanted surface facing.

11. A connector for receiving a card therein, comprising:
   an insulative housing;
   at least an ejector positioned within the housing;
   said ejector including an elongated main body with at least an kicker at a bottom portion;
   a slot extending along most lengthwise portions of the main body; and
   at least a relatively large retention protrusion disposed adjacent a position where a maximum inward deflection occurs along said slot of the main body.

12. The connector as defined in claim 11, wherein a space formed by the slot is only to allow the inward deflection of the main body thereabout so that the protrusions can pass an end wall of the housing, whereby no portion of the housing or of the card is received within said space.

13. The connector as defined in claim 11, wherein said retention protrusion extends laterally in a dimension substantially in compliance with a width of the main body of the ejector.

14. A card edge connector comprising:
   an insulative housing defining a central channel for receiving a card therein;
   a tower disposed adjacent one end of the housing for mounting an ejector thereto;
   said ejector including a main body from which a kicker extends horizontally toward the central channel, and along which a slot extends in a significant distance so as to provide sufficient resiliency about retention means on the main body wherein said retention means is adapted to be relatively large to resist wearing against an end wall during rotation of the ejector.

* * * * *